United States Patent
Hwang et al.

(10) Patent No.: US 7,582,502 B1
(45) Date of Patent: Sep. 1, 2009

(54) METHOD FOR MANUFACTURING BACK SIDE ILLUMINATION IMAGE SENSOR

(75) Inventors: Joon Hwang, Cheongju-si (KR); Hee Sung Shim, Gangneung-si (KR)

(73) Assignee: Dongbu Hitek Co., Ltd., Seoul (KR)

( * ) Notice: Subject to any disclaimer, the term of this patent is extended or adjusted under 35 U.S.C. 154(b) by 0 days.

(21) Appl. No.: 12/262,618

(22) Filed: Oct. 31, 2008

(30) Foreign Application Priority Data

Aug. 6, 2008 (KR) ...................... 10-2008-0076946

(51) Int. Cl.
*H01L 21/00* (2006.01)
(52) U.S. Cl. ........................... 438/59; 438/70; 438/202; 438/207; 438/232; 438/238; 257/E21.001
(58) Field of Classification Search .................. 438/59, 438/65, 202; 257/228, 447
See application file for complete search history.

(56) References Cited

U.S. PATENT DOCUMENTS

| 6,191,007 B1* | 2/2001 | Matsui et al. ................ 438/459 |
| 2008/0203452 A1* | 8/2008 | Moon et al. .................. 257/292 |

* cited by examiner

*Primary Examiner*—N Drew Richards
*Assistant Examiner*—Kyoung Lee
(74) *Attorney, Agent, or Firm*—Saliwanchik, Lloyd & Saliwanchik

(57) ABSTRACT

Provided are methods for manufacturing a back side illumination image sensor. In one method, an ion implantation layer is formed in an entire region of a front side of a first substrate. A device isolation region is formed in the front side of the first substrate to define a pixel region. A light sensing unit and a readout circuitry are formed in the pixel region. An interlayer insulating layer and a metal line are formed on the first substrate. A second substrate is bonded to the front side of the first substrate on which the metal line is formed. A lower side of the first substrate under the ion implantation region is removed such that the light sensing unit is available at the backside of the first substrate.

20 Claims, 4 Drawing Sheets

METHOD FOR MANUFACTURING BACK SIDE ILLUMINATION IMAGE SENSOR

CROSS-REFERENCE TO RELATED APPLICATION

The present application claims the benefit under 35 U.S.C. § 119 of Korean Patent Application No. 10-2008-0076946, filed Aug. 6, 2008, which is hereby incorporated by reference in its entirety.

BACKGROUND

An image sensor is a semiconductor device that converts an optical image to an electric signal. Image sensors are generally classified as a charge coupled device (CCD) image sensor or a complementary metal oxide semiconductor (CMOS) image sensor (CIS).

In a related art image sensor, a photodiode is formed in a substrate using ion implantation. As the size of a photodiode reduces more and more for the purpose of increasing the number of pixels without an increase in chip size, the area of a light receiving portion reduces, which results in a reduction of image quality.

Also, since a stack height does not reduce as much as the reduction in the area of the light receiving portion, the number of photons incident to the light receiving portion also reduces due to diffraction of light called Airy disk.

As an alternative to overcome this limitation, there is an attempt to minimize a height of an upper surface of the light receiving portion and eliminate light interference due to a metal routing by receiving light through a wafer back side. Image sensors utilizing such an approach can be referred to as back side illumination image sensors.

In a related art back side illumination image sensor, processes for forming a light receiving device and a metal line are performed on a front side of a substrate, and then a back grinding to remove a back side of the substrate by a predetermined thickness is performed. The back grinding is performed so as to adjust an interval between an external module and an optical lens by grinding the back side of the substrate to a proper thickness.

According to a related art back side illumination image sensor, a Silicon On Insulator (SOI) wafer is used as a donor wafer on which a light receiving device and a circuitry are formed. Then, the SOI wafer is bonded to a handle wafer. Thereafter, a backside thinning process for the donor wafer is performed.

The backside thinning process for the donor wafer according to the related art is described below.

First, a backside grinding for the donor wafer is performed such that only a thickness of several tens of micrometers about a top surface of a buried oxide (BOX) remains. Thereafter, an etch-back is performed to complete the backside thinning process.

However, since the related art back side illumination image sensor uses the expensive SOI wafer as the donor wafer, the manufacturing cost is very high.

Also, the backside grinding for the donor wafer according to the related art may cause a wafer edge thinning. If the wafer edge thinning occurs, failures of chips positioned at a wafer edge may be generated, so the yield is lowered.

In addition, according to the related art, since the wafer center is also exposed to plasma damage during the etch-back process to etch the wafer by a thickness of several tens of micrometers, there may be a problem that the degeneration possibility of the image sensor is increased.

Another approach according to the related art is an image sensor (which is referred to as "3D image sensor") in which a photodiode is formed by depositing amorphous silicon. A readout circuitry is formed on an Si substrate and the photodiode is formed on another wafer, a wafer-to-wafer bonding is performed and thus the photodiode is formed on the readout circuitry. The photodiode and the readout circuitry are connected through a metal line.

After positioning the photodiode on the wafer having the readout circuitry, a bonding process is performed. At this time, the readout circuitry may be not electrically properly connected with the photodiode due to a bonding problem. For example, a metal line is often formed on the readout circuitry and then the wafer-to-wafer-bonding is performed such that the metal line contacts the photodiode. However, at this time, it may be difficult to correctly contact the metal line with the photodiode, and it may be difficult to provide an ohmic contact between the metal line and the photodiode. Also, according to the related art, the metal lines connected with the photodiode may be shorted. Though there are researches for preventing the shortage between the metal lines, it is problematic that a complicated process is required.

BRIEF SUMMARY

Embodiments of the present invention provide a method for manufacturing a back side illumination image sensor that can remove a back side of a substrate stably and efficiently.

Embodiments also provide a method for manufacturing a back side illumination image sensor that can reduce the manufacturing cost.

Embodiments also provide a method for manufacturing a back side illumination image sensor that can maximize the amount of incident light and reduce interference and reflection of light due to a metal routing.

In one embodiment, a method for manufacturing a back side illumination image sensor can comprise: forming an ion implantation layer in a region of a front side of a first substrate; forming a device isolation region in the front side of the first substrate to define a pixel region after forming the ion implantation layer; forming a light sensing unit and a readout circuitry in the pixel region; forming an interlayer insulating layer and a metal line on the first substrate; bonding a second substrate to the front side of the first substrate on which the metal line is formed; removing a lower side of the first substrate under the ion implantation region; and forming a microlens on the light sensing unit at the back side of the first substrate.

In another embodiment, a method for manufacturing a back side illumination image sensor can comprise: forming a device isolation region in a front side of a first substrate to define a pixel region; forming an ion implantation layer in a region of the front side of the first substrate after forming the device isolation region; forming a light sensing unit and a readout circuitry in the pixel region; forming an interlayer insulating layer and a metal line on the first substrate; bonding a second substrate to the front side of the first substrate on which the metal line is formed; removing a lower side of the first substrate under the ion implantation region; and forming a microlens on the light sensing unit at the back side of the first substrate.

In yet another embodiment, a method for manufacturing a back side illumination image sensor can comprise: forming an ion implantation layer in a region of a front side of a first substrate; forming a light sensing unit and a readout circuitry in the front side of the first substrate; forming an interlayer insulating layer and a metal line on the front side of the first substrate; bonding a second substrate to the front side of the first substrate; removing a lower side of the first substrate under the ion implantation region while using the second substrate as a handle; and forming a microlens on the light sensing unit at the back side of the first substrate.

In still another embodiment, a method for manufacturing a back side illumination image sensor can comprise: forming an ion implantation layer in an entire region of a front side of a first substrate; forming a light sensing unit and a readout circuitry in the front side of the first substrate in which the ion implantation layer is formed; forming an interlayer insulating layer and a metal line on the front side of the first substrate; bonding a second substrate to the front side of the first substrate; and removing a lower side of the first substrate under the ion implantation region.

In yet another embodiment, a method for manufacturing a back side illumination image sensor can comprise: forming a light sensing unit in a front side of a first substrate; forming an ion implantation layer in the front side of the first substrate in which the light sensing unit is formed; forming a readout circuitry in the front side of the first substrate; forming an interlayer insulating layer and a metal line on the front side of the first substrate; bonding a second substrate to the front side of the first substrate; and removing a lower side of the first substrate under the ion implantation region.

The details of one or more embodiments are set forth in the accompanying drawings and the description below. Other features will be apparent from the description and drawings, and from the claims.

DETAILED DESCRIPTION

Methods for manufacturing a back side illumination image sensor will be described in detail with reference to the accompanying drawings.

In the description of embodiments, it will be understood that when a layer (or film) is referred to as being 'on' another layer or substrate, it can be directly on another layer or substrate, or intervening layers may also be present. Further, it will be understood that when a layer is referred to as being 'under' another layer, it can be directly under another layer, or one or more intervening layers may also be present. In addition, it will also be understood that when a layer is referred to as being 'between' two layers, it can be the only layer between the two layers, or one or more intervening layers may also be present.

Figure 1A:
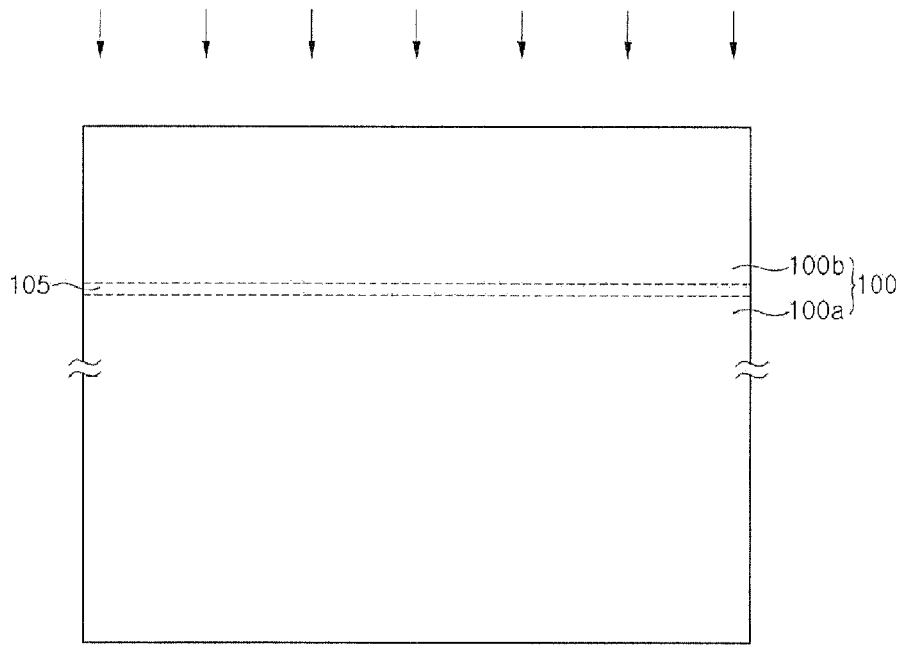
FIG. 1A to FIG. 5 are sectional views illustrating a method for manufacturing a back side illumination image sensor according to an embodiment.
Figure 1B:
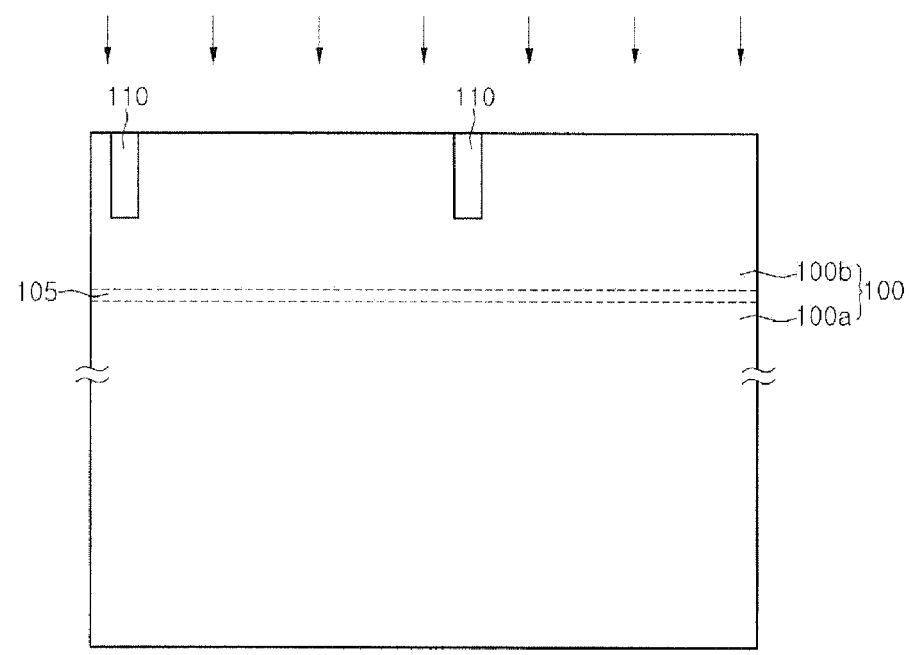
Figure 1C:
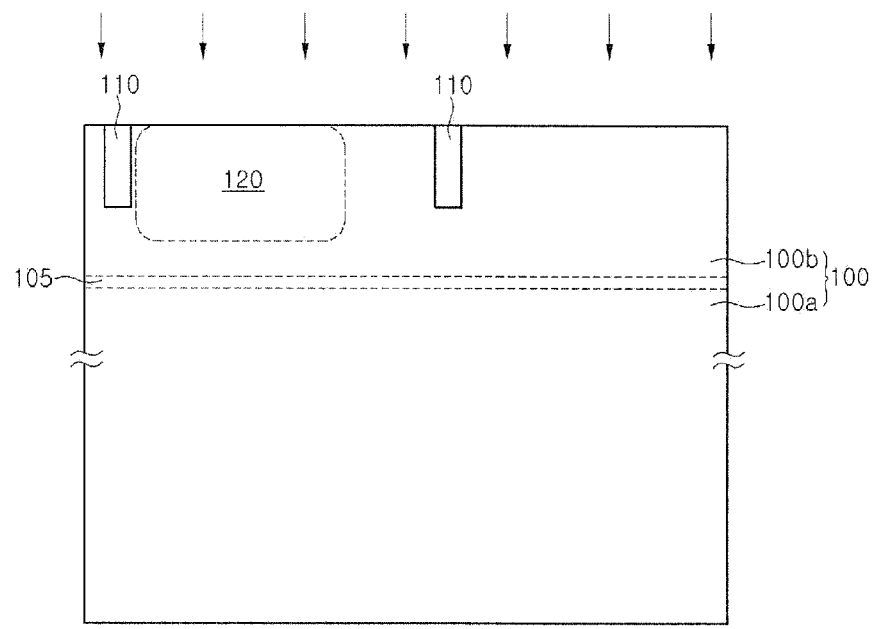

FIGS. 1A to 1C exemplarily show operations of forming an ion implantation layer 105 according to certain embodiments of the present invention.

Referring to FIG. 1A, tan ion implantation layer 105 can be formed in a front side of a first substrate 100. The first substrate 100 can be an Epi wafer, but the present invention is not limited thereto. In embodiments, a lower side 100a of the first substrate 100 and an upper side 100b of the first substrate 100 may be defined about the ion implantation layer 105.

In the method for manufacturing a back side illumination image sensor according to one embodiment, an Epi wafer can be used as the substrate 100 acting as a donor wafer. When the Epi wafer is used as the donor wafer, the manufacturing cost can be saved remarkably compared with an SOI wafer.

According to an embodiment using an Epi wafer as a donor wafer, because a light sensing unit and a circuitry can be formed on the Epi wafer together, a back side illumination image sensor may be easily manufactured without a bonding process necessary for a 3D image sensor where a photodiode is formed on a circuitry. Accordingly, it is unnecessary to consider the bonding issue and contact issue as in the 3D image sensor.

The ion implantation layer 105 can be formed through performing an ion implantation to the front side of the first substrate 100. Since a back side of the first substrate 100 has a thickness of several hundreds of micrometers, it is preferable to perform the ion implantation through the front side of the substrate.

That is, since the thickness of the first substrate 100 is very large compared with a depth of the ion implantation layer 105, it can be difficult to perform the ion implantation through the back side of the substrate 100. Therefore, by forming the ion implantation layer 105 in advance before the forming of a metal line 140 (see FIG. 2) or the bonding of the first substrate 100 to a second substrate 200 (see FIG. 3), it is possible to easily remove the lower side 100a of the first substrate 100 after the bonding of the first substrate 100 to the second substrate 200.

According to an embodiment, the forming of the ion implantation 105 can be performed by implanting ions such as hydrogen (H) or helium (He). However, the present invention is not limited thereto.

In another embodiment, the ion implantation layer 105 can be formed after forming a device isolation layer 110 in the front side of the first substrate 100 as shown in FIG. 1B. In an embodiment, the device isolation layer 110 can be formed in the front side of the first substrate 100 by, for example, a shallow trench isolation (STI) to define a pixel region, and then the ion implantation layer 105 can be formed.

Since the method according to embodiments easily and stably removes the back side of the first substrate 100 not by a grinding, but by using the ion implantation layer 105 formed in advance, the method can remarkably enhance the production yield of the back side illumination image sensor.

Also, in an embodiment, the ion implantation process using hydrogen (H) or helium (He) ions can be performed so as to form a cleaving layer in advance during the process using the Epi wafer. After the processes for the first substrate 100 acting as the donor wafer are completed, the first substrate 100 can be bonded to a second substrate 200 acting as a handle wafer. The handle wafer 200 is used because the first substrate 100 of which the lower side is removed is in a thin state and the handle wafer 200 helps in smoothly performing subsequent processes.

Thereafter, a cleaving can be performed for a backside thinning of the first substrate 100 that is the donor wafer.

According to an embodiment, by employing the ion implantation and the cleaving process, a back grinding and an etch-back are unnecessary, so that the related art problems such as an edge die fail, plasma damage and the like are not generated.

Also, according to an embodiment, since a grinding for the donor wafer is not performed, a physical stress is not applied to the donor wafer, so that damage to the light sensing unit and the readout circuitry can be inhibited.

Referring to FIG. 1C, in yet another embodiment, the ion implantation layer 105 can be formed after the light sensing unit 120 is formed in the pixel region. The light sensing unit 120 can be a photodiode, but embodiments are not limited thereto. In one embodiment, the light sensing unit 120 can be prepared by forming an N-type ion implantation region 120 in a P-type first substrate 100 and forming a $P_o$ region (not shown) on the N-type ion implantation region 120 of the first substrate 100. However, embodiments are not limited thereto. For embodiments utilizing such a light sensing unit 120, the $P_o$ region can be used to inhibit extra electrons from being generated. Also, by forming the PNP junction (P-substrate, N-type in implant region 120, $P_o$ region), a charge dumping effect can be obtained.

Figure 2:
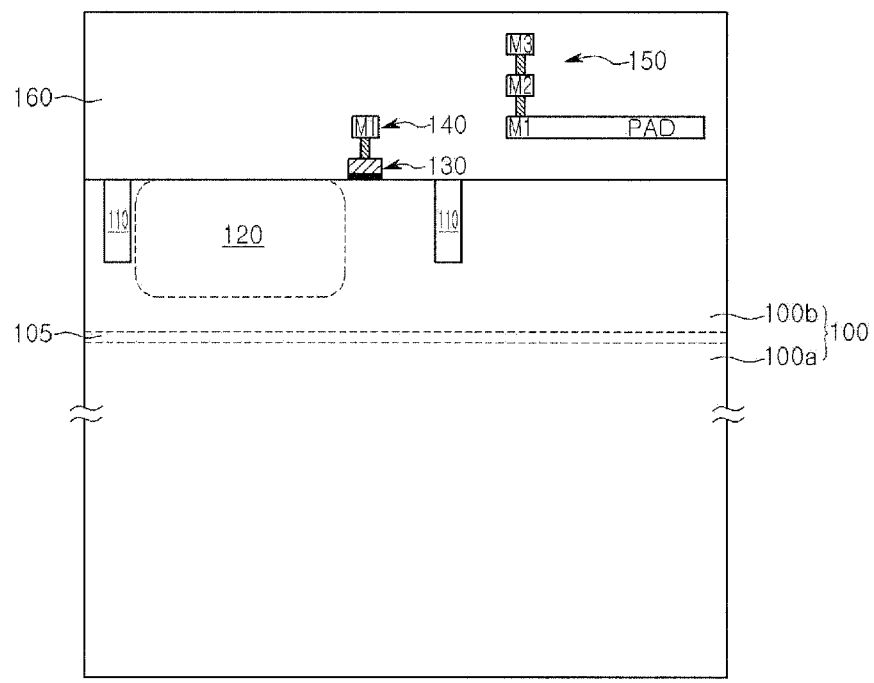

Referring to FIG. 2, after forming the ion implantation layer 105, a readout circuitry 130 can be formed on the first substrate 100 on which the light sensing unit 120 is formed. The readout circuitry 130 can include a transfer transistor, a reset transistor, a drive transistor, a select transistor and the like, but embodiments are not limited thereto.

An interlayer insulating layer 160 can be formed on the first substrate 100, and a metal line 140 can be formed in the interlayer insulating layer 160. The metal line 140 can include a first metal M1 and the like.

A pad line 150 can also be formed in a logic region. The pad line 150 can include a first metal M1, a second metal M2, a third metal and the like, but is not limited thereto. At this time, a pad PAD can be formed on the same level as the first metal M1. By doing so, after the bonding between the first substrate 100 and the second substrate 200, a pad opening process from the back side of the first substrate 100 can be easily performed. This is because the depth from the back side of the first substrate 100 to the pad PAD is low.

Figure 3:
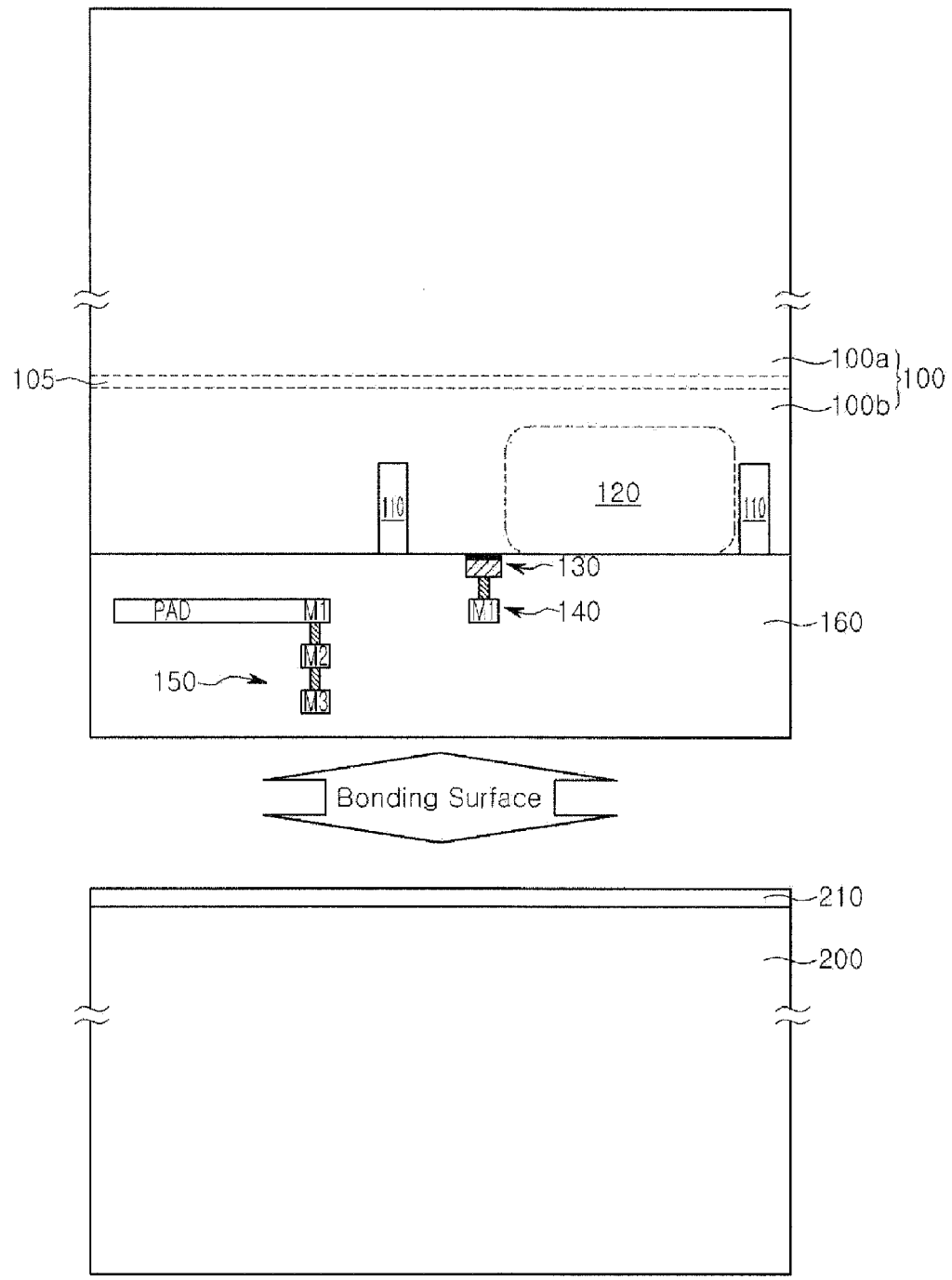

Next, referring to FIG. 3, a second substrate 200 can be bonded to the front side of the first substrate 100 on which the metal line 140 is formed. For example, the second substrate can be bonded to the front side of the first substrate 100 such that the second substrate 200 (handle wafer) corresponds to the metal line 140 of the first substrate 100.

The method according to an embodiment can enhance the bonding force between the second substrate 200 and the first substrate 100 by forming an insulating layer 210 on the second substrate before bonding to the first substrate 100. The insulating layer 210 can be an oxide layer or nitride layer, but is not limited thereto. The bonding force between the first substrate 100 and the second substrate 200 can be remarkably increased by contacting the insulating layer 210 with the interlayer insulating layer 160 of the front side of the first substrate 100 and bonding the insulating layer 210 to the interlayer insulating layer 160.

According to an embodiment, since the Epi wafer can be used as the first substrate 100 (donor wafer) and the light sensing unit 120 and the readout circuitry 130 can be formed on the first substrate 100 together, a back side illumination image sensor can be easily manufactured without a bonding process necessary for a 3D image sensor in which a photodiode is formed on a circuitry. Therefore, it is also unnecessary to consider a bonding issue and a contact issue. Meanwhile, since the bonding between the handle wafer and the donor wafer is performed in a state that an interlayer insulating layer is interposed therebetween, the bonding issue is mitigated.

In addition, according to embodiments, a stack (or material layer thickness) on the light sensing unit can be minimized to maximize the amount of incident light. In addition, since light interference and reflection phenomena due to a metal routing are not generated, light characteristics of the image sensor can be maximized.

Figure 4:
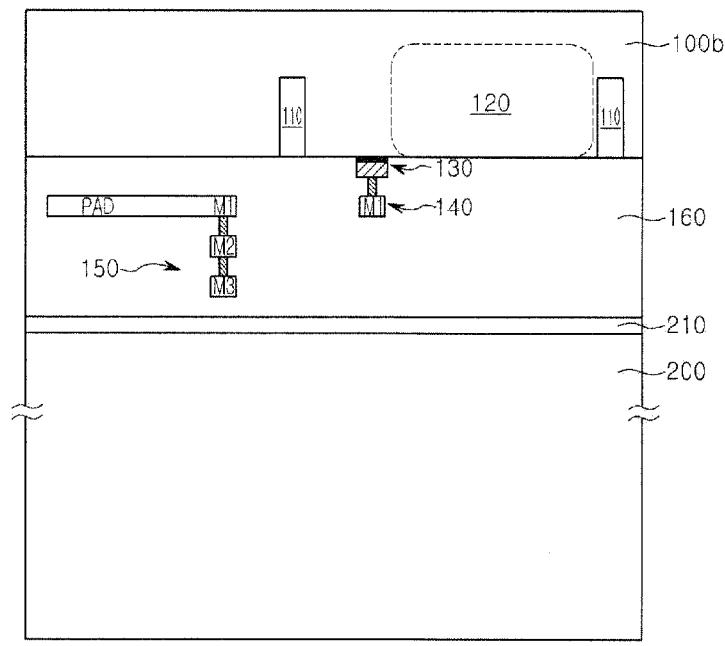

Next, referring to FIG. 4, the lower side 100a of the first substrate 100 can be removed about the ion implantation layer 105 from the first substrate 100 that is bonded to the second substrate. For example, the ion implantation layer 105 can be thermally annealed to bubble the hydrogen ions, and then the lower side 100a of the first substrate 100 is cut and removed by using a blade to leave the upper side 100b of the first substrate 100 on the handle wafer 200. Thereafter, the cut surface of the first substrate 100 can be planarized.

For related art 3-D image sensors fabricated using a cleaving technique, the light sensing unit and the readout circuitry are formed on a separate wafer and then bonding and interconnection processes are performed. In this related art, hydrogen or helium ion implantation process for forming the cleaving layer is performed directly before the bonding process.

Furthermore, according to the related art 3D image sensor, it is difficult to correctly perform an electrical connection between the readout circuitry and the photodiode, and the metal lines electrically connected with the photodiode may be shorted.

In contrast, according to embodiments of the present invention, since an Epi wafer can be used as the first substrate 100 acting as the donor wafer, and the light sensing unit 120 and the readout circuitry 130 can be formed in the first substrate 100 together, there is no need of bonding process between a substrate on which the light sensing unit is formed and a substrate on which a circuitry is formed, such as in the process of a 3D image sensor in which the light sensing unit is formed on the circuitry. Accordingly, the manufacturing process can be easily performed and bonding issues and contact issues can be removed.

The reason why hydrogen or helium ion implantation process is performed directly before the bonding process in the related art 3D image sensor is because electrons generated in the light sensing unit are delivered to a electronic circuitry and converted into a voltage. That is, a photodiode PD is formed in one substrate without forming a metal and an interlayer insulating layer on that substrate.

However, according to embodiments of the present invention, the light sensing unit 120 and the readout circuitry 130 are formed together on the same wafer, i.e., the first substrate 100. Therefore, the wafer being cleaved according to the embodiment requires a back end of line (BEOL) process such as the forming of the metal line 140 and the forming of the interlayer insulating layer 160.

Thus, in using the process scheme according to the embodiment, it is not possible to perform the ion implantation process directly before the bonding process as in the related art. Instead, according to embodiments, the ion implantation layer 105 can be formed by performing the hydrogen or helium ion implantation process before forming the metal line 140 and the interlayer insulating layer 160 on the Epi wafer used as the first substrate 100 that is the donor wafer.

Figure 5:
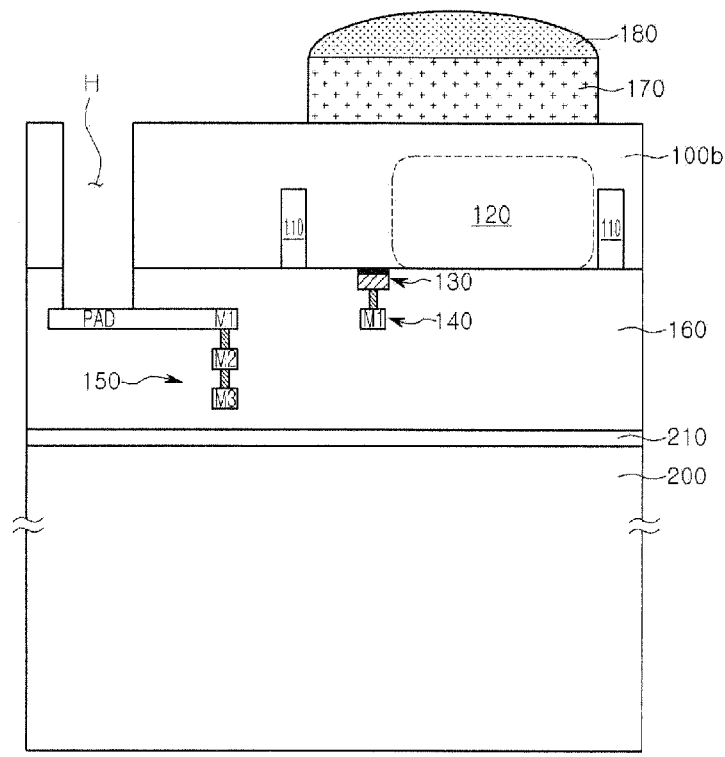

Next, as shown in FIG. 5, a color filter 170 can be formed on the light sensing unit 120 at the back side of the first substrate 100. In embodiments where the light sensing unit 120 is an R, G, B vertical stack type photodiode, the color filter can be omitted.

Next, a microlens 180 can be formed on the color filter 170.

Thereafter, a process of opening the pad PAD can be performed. In an embodiment, the pad opening process can be performed from the back side of the first substrate. That is, since the pad PAD is formed on the same level as the first metal M1, the pad PAD can be easily opened from the back side of the first substrate 100.

In the method for manufacturing a back side illumination image sensor according to embodiments, the back side of the substrate can be stably and efficiently removed using an ion implantation technique. That is, since a back grinding or an etch-back process is not required, an edge die fail and plasma damage is not generated.

Also, according to an embodiment, since a grinding for the donor wafer is not performed, damage to the light sensing unit and the circuitry can be reduced.

In addition, according to an embodiment, by using an Epi wafer as the donor wafer, the light sensing unit and the circuitry can be formed together on the Epi wafer. Furthermore, by using the Epi wafer instead of an SOI wafer, the manufacturing cost can be remarkably decreased.

According to embodiments, since the Epi wafer can be used as the donor wafer and the light sensing unit and the circuitry can be formed together in the Epi wafer, a back side illumination image sensor may be easily manufactured without a bonding process necessary for a 3D image sensor in which a photodiode is formed on the circuitry, and it is also unnecessary to consider a bonding issue and a contact issue. Meanwhile, since the bonding between the handle wafer and the donor wafer is performed in a state that an interlayer insulating layer is interposed therebetween, the bonding issue is mitigated.

Moreover, according to an embodiment, a stack on the light sensing unit can be minimized to maximize the amount of incident light, and since light interference and reflection phenomena due to a metal routing are not generated, light characteristics of the image sensor can be maximized.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A method for manufacturing a back side illumination image sensor, comprising:
    forming an ion implantation layer in a region of a front side of a first substrate;
    forming a device isolation region in the front side of the first substrate to define a pixel region;
    forming a light sensing unit and a readout circuitry in the pixel region;
    forming an interlayer insulating layer and a metal line on the first substrate;
    bonding a second substrate to the front side of the first substrate on which the metal line is formed; and
    removing a lower side of the first substrate under the ion implantation region.

2. The method according to claim 1, wherein the forming of the ion implantation layer is performed before forming the device isolation region.

3. The method according to claim 1, wherein the forming of the ion implantation layer is performed after forming the device isolation region, but before forming the light sensing unit and the readout circuitry.

4. The method according to claim 1, wherein the forming of the ion implantation layer is performed after forming the light sensing unit, but before forming the readout circuitry.

5. The method according to claim 1, wherein the forming of an ion implantation layer comprises performing a hydrogen ion implantation or a helium ion implantation.

6. The method according to claim 1, wherein the forming of the ion implantation layer comprises performing an ion implantation through the front side of the first substrate.

7. The method according to claim 1, wherein the removing of the lower side of the first substrate under the ion implantation layer comprises performing a thermal treatment of the ion implantation layer.

8. The method according to claim 1, further comprising forming a color filter on the back side of the first substrate after the removing of the lower side of the first substrate.

9. The method according to claim 1, further comprising forming a microlens on the light sensing unit of the back side of the first substrate after the removing of the lower side of the first substrate.

10. The method according to claim 1, further comprising opening a pad formed during the forming of the interlayer insulating layer and the metal line after the removing of the lower side of the first substrate under the ion implantation layer.

11. The method according to claim 10, wherein the opening of the pad comprises etching to the pad from the back side of the first substrate.

12. The method according to claim 1, prior to the bonding of a second substrate to the first substrate, further comprising forming an insulating layer on the second substrate, wherein the second substrate is bonded to the first substrate such that the insulating layer formed on the second substrate contacts the front side of the first substrate.

13. A method for manufacturing a back side illumination image sensor, comprising:
    forming an ion implantation layer in a region of a front side of a first substrate;
    forming a light sensing unit in the front side of the first substrate;
    forming a readout circuitry on the front side of the first substrate;
    forming an interlayer insulating layer and a metal line on the front side of the first substrate;
    bonding a second substrate to the front side of the first substrate; and
    removing a lower side of the first substrate under the ion implantation region.

14. The method according to claim 13, wherein forming the ion implantation layer comprises implanting hydrogen or helium ions into the front side of the first substrate in which the light sensing unit is formed.

15. The method according to claim 13, wherein forming the ion implantation layer comprises implanting hydrogen or helium ions into the front side of the first substrate before forming the light sensing unit.

16. The method according to claim 13, wherein the removing of the lower side of the first substrate under the ion implantation layer comprises performing a thermal treatment of the ion implantation layer.

17. The method according to claim 13, further comprising forming a color filter on the back side of the first substrate after the removing of the lower side of the first substrate.

18. The method according to claim 13, further comprising forming a microlens on the light sensing unit of the back side of the first substrate after the removing of the lower side of the first substrate.

19. The method according to claim 13, prior to the bonding of a second substrate to the first substrate, further comprising forming an insulating layer on the second substrate, wherein the second substrate is bonded to the first substrate such that the insulating layer formed on the second substrate contacts the front side of the first substrate.

20. The method according to claim 13, further comprising opening a pad formed during the forming of the interlayer insulating layer and the metal line after the removing of the lower side of the first substrate under the ion implantation layer.

* * * * *